US006408356B1

(12) United States Patent
Dell (10) Patent No.: US 6,408,356 B1
(45) Date of Patent: Jun. 18, 2002

(54) APPARATUS AND METHOD FOR MODIFYING SIGNALS FROM A CPU TO A MEMORY CARD

(75) Inventor: Timothy J. Dell, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/440,996

(22) Filed: Nov. 16, 1999

(51) Int. Cl.[7] .................................................. G11C 8/00
(52) U.S. Cl. ........................ 711/105; 711/106; 711/167; 711/211; 365/222; 365/230.01; 365/233
(58) Field of Search ................................ 711/105, 106, 711/167, 211; 365/222, 230.01, 233

(56) References Cited

U.S. PATENT DOCUMENTS

| | | | |
|---|---|---|---|
| 4,656,605 A | 4/1987 | Clayton | 365/52 |
| 4,882,700 A | 11/1989 | Mauritz et al. | 365/51 |
| 5,241,643 A | 8/1993 | Durkin et al. | 395/425 |
| 5,253,357 A | 10/1993 | Allen et al. | 395/425 |
| 5,260,892 A | 11/1993 | Testa | 365/63 |
| 5,270,964 A | 12/1993 | Bechtolsheim et al. | 365/52 |
| 5,272,664 A | 12/1993 | Alexander et al. | 365/52 |
| 5,278,801 A | 1/1994 | Dresser et al. | 365/230.02 |
| 5,357,624 A | 10/1994 | Lavan | 395/425 |
| 5,371,866 A | 12/1994 | Cady | 395/400 |
| 5,414,670 A | 5/1995 | Schaefer | 365/230.03 |
| 5,465,237 A | * 11/1995 | Chen et al. | 365/233 |
| 5,613,094 A | * 3/1997 | Khan et al. | 703/23 |

OTHER PUBLICATIONS

IBM Technical Disclosure Bulletin, vol. 37, No. 10, Oct. 1994 "Stacking Single Inline Memory Module Card".

* cited by examiner

Primary Examiner—Hong Kim
Assistant Examiner—Jasmine Song
(74) Attorney, Agent, or Firm—William N. Hogg (57) ABSTRACT

According to the present invention, a computer system and method of operation of the system is provided wherein the computer system has a memory controller which generates first and second RAS signals and Y rows of addresses in memory, and wherein the memory of the system, either as a planar or add-on memory, is configured with Y+1 rows of addresses operable by a single RAS. The system includes logic, preferably which is on an ASIC chip, to convert one of the RAS signals from the memory controller in conjunction with at least one address list to the high order address bit for the memory rows, thus constituting Y+1 rows of addressable space. The logic also generates a master RAS signal when either RAS generated by the memory controller goes active. The logic also provides for a refresh operation of all of the memory locations during a RAS only refresh operation. This is preferably controlled by a counter in the logic circuit which assures that each row gets refreshed in order when both RAS's go LOW for a refresh cycle.

22 Claims, 5 Drawing Sheets

APPARATUS AND METHOD FOR MODIFYING SIGNALS FROM A CPU TO A MEMORY CARD

RELATED APPLICATIONS

This application is related to application Serial No. 08/582,010, filed Jan. 2, 1996, entitled "Method and Apparatus for Modifying Signals Received by Memory Cards".

FIELD OF THE INVENTION

This invention relates generally to personal computer systems which utilize SIMMs for memory, and more particularly to a personal computer system and a SIMM for use thereon wherein the SIMM is configured to utilize DRAMs having greater row address space than there are row address signals from the memory controller to address the DRAMs.

BACKGROUND INFORMATION

Personal computer systems have been designed which are adapted to use Single Inline Memory Modules (SIMMs) as on-board memory. The SIMMs utilize random access memory (RAM) which can be either dynamic random access memory (DRAMs) or static random access memory (SRAMs). The computer system utilizes a memory controller in the form of an integrated circuit (IC) chip which controls the various signals which are sent from the central processing unit (CPU) to the memory to either write data to or read data from the memory. The memory controller is designed to accommodate certain configurations of DRAM chips and SIMMs. For example, a common SIMM has been a 72-pin SIMM which utilizes 16 1M×4 DRAM chips to provide 8 megabytes of memory. This configuration allocates a certain number of pins for addressing memory locations and provides two row activation signals (RAS) for activating the DRAMs on either read or write cycles. The DRAMs are functionally arranged in two sets of 8 chips each, with each set having ten row addresses and ten column addresses. Such an address configuration is known as a 10×10. Thus, the need arises for two RAS's, one RAS for one of the sets of 8 chips and one for the other set of 8 chips. Hence, this scheme is known as 10×10 addressing with two sets of addressable chips. To address one set of DRAM chips, one of the RAS signals is driven active, and to address the other set of DRAM chips the other RAS signal is driven active.

As chip technology progresses and larger size chips become cheaper, it becomes economical to replace several chips with a single chip. One particular configuration of chips which has become readily available at attractive prices is a 2M×8 chip, which contains four times the amount of data as a 1M×4. Thus, 4 2M×8 chips can store the same amount of data as 16 1M×4 chips. Thus, these chips are desirable to be utilized on a SIMM for cost reasons. However, it is desirable in providing or utilizing these more cost-effective chips that they be utilized in systems having pre-existing memory controllers which have been designed for the 1M×4 chips. This causes a problem. The 2M×8 SIMMs require 11 row addresses rather than the 10 required by the 1M×4 chips, and thus there is not the available row address without the addition of another pin and significant redesign—and even then the design becomes difficult because all 72 pins have normally been utilized. However, only one RAS signal is needed to activate the read or write functions of the four chips. Thus, one technique to overcome the 11 row limitation is by utilizing the signal on one of the RAS lines to function as an address bit on the 11th row address space.

While this does work, it has certain disadvantages. One of the disadvantages is that utilizing one of the RAS's directly on the 11th address bit will not accommodate a refresh function when refresh is done by both RAS's going low, known as ROR (RAS Only Refresh), rather than the refresh function being performed by a CAS before RAS signal configuration known as CBR (CAS Before RAS). This is because the 11th address bit will always be active when both RAS's go active, thus refreshing only one-half of the chip, i.e., the address portion of the chip utilizing the active bit in the 11 th address space which is the most significant bit. Another problem is that since only a single RAS activation is necessary for the 2M×8 chips, logic such as an AND gate is necessary to perform a row activation function when either RAS input goes low. This additional logic can lead to timing problems, especially with respect to the timing in which activation of the 11th row address takes place, vis-a-vis, the activation of the RAS signal on the chip following the logic circuitry to combine the two RAS signals as a single master RAS signal. OM solution is found in related application Serial No. 08/582,010. However, this solution uses only one of the RAS signals to generate the high order bit, and thus can generate hot spots in memory under certain conditions.

It is therefore an object of the present invention to provide a computer system and SIMM configuration and method of operation which allows DRAMs having a greater number of row address than are supplied by a memory controller to be used by a system using such a memory controller, which eliminates the cause of hot spots during certain operations

SUMMARY OF THE INVENTION

A computer system and method of operation is provided wherein the memory controller of the system generates first and second address signals, typically RAS signals, and address bits for Y rows of addresses in memory; and wherein the memory of the system is configured with Y+1 rows of addresses operable by a single address signal, typically a single RAS signal. The system includes logic, preferably on an ASIC chip that converts one of said RAS signals from the memory controller, together with at least one address signal generated by the CPU and propagated by the system memory controller, to the high order address bit for the memory rows, thus constituting Y+1 rows of address activated space, and generates a master RAS signal when either RAS generated by the memory controller goes active. The logic also provides for a refresh operation of all memory location during a RAS only refresh (ROR) operation.

DESCRIPTION OF THE PREFERRED EMBODIMENTS

The preferred embodiment will be described in the environment of an IBM personal computer using an Intel 80386 or 80486 or Pentium Microprocessor with Single Inline Memory Modules (SIMMs) having Dynamic Random Access Memory (DRAM) chips to provide and control the memory's function. (A SIMM is sometimes referred to as a DRAM card, which means the DRAM and all the chips and circuits on the SIMM.) For the purpose of this description, the system will be described as it is used with a CPU capable of generating parity bits for each of the data bytes that it writes, and also reading and comparing parity information read from storage, although such parity generation is not essential for the purpose of the present invention.

Figure 1:
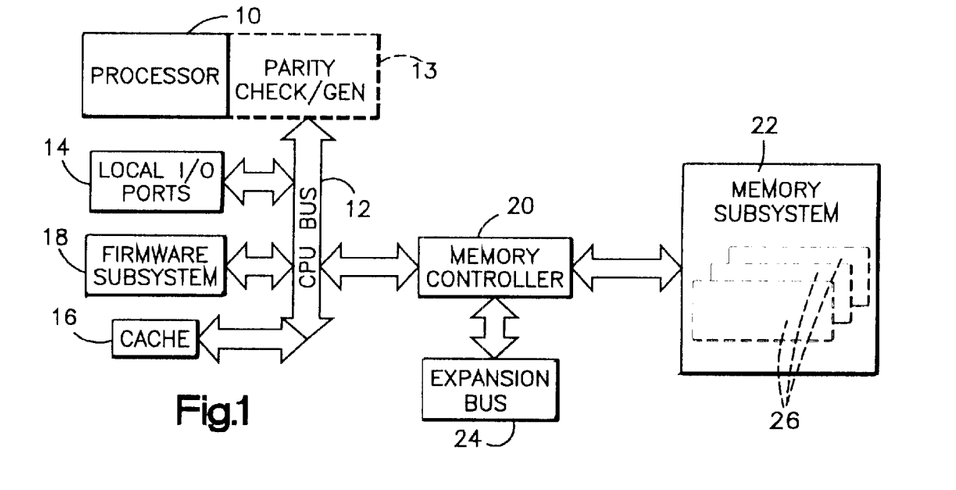
FIG. 1 is a high level diagram showing the interconnections of a personal computer with a bus and an add-on memory card according to this invention.

As can be seen in FIG. 1, there is provided a CPU 10 which is connected to a CPU or system bus 12. A parity generation and check unit 13 preferably is provided which also generates or checks parity of data being either written by or read by the CPU 10 to or from the bus 12. The CPU bus 12 may also have local I/O ports 14, CACHE memory 16 and firmware or other subsystems 18 associated therewith. A memory controller 20 is also connected to the system bus 12, coupling it to a memory subsystem 22, and to an expansion bus 24, if one is present. The memory subsystem 22 is typically comprised of one or more SIMMs 26, each of which is provided with DRAM chips. (DRAMs require periodic refresh operations, as opposed to SRAMs which do not require refresh.) It is to be understood that the system as described is illustrative of systems on which the configuration of the DRAM chips and utilization of the signals can be used, but other systems can function in conjunction with the SIMMs having the DRAM configuration of the present invention.

As indicated, the CPU 10 is capable of writing data onto the bus 12, which in turn will be conveyed to the correct memory addresses in the subsystem 22 by a memory controller 20. Upon writing data by the CPU 10, parity bits are generated for each byte of information written to memory by the parity generating and checking device 13 which also checks parity on information read from the memory subsystem 22 during a read cycle to determine if there is parity error. The memory controller 20 also provides the necessary signals, such as the Row Activation Strobe (RAS) for the RAS signals, two of which are generated in the present case RAS0 and RAS1, Column Activation Strobe (CAS), Write Enable (WE) and, on some systems, Output Enable (OE) and Byte Select (BS), as well as others not shown, to the memory subsystem 22. The memory controller reads and writes both data and parity to/from each SIMM 26. It should be understood that the invention is applicable to a wide variety of SIMMs having many different form factors, although it is particularly useful for a 72-pin SIMM which is configured having the DRAMs in two sets, wherein each set receives a different RAS signal, thus requiring two RAS signals from the memory controller as will be explained presently.

Figure 2:
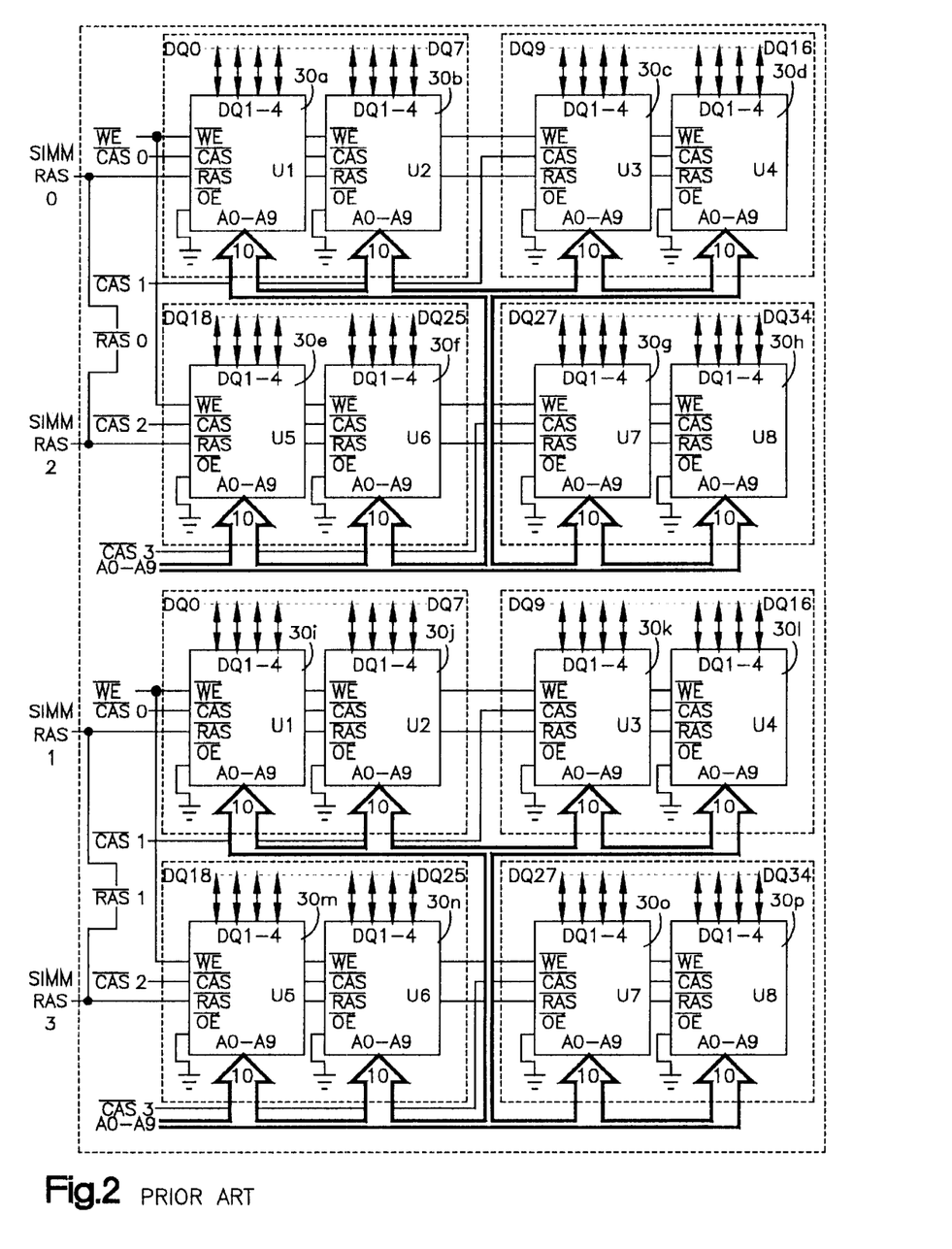
FIG. 2 is a high level schematic representation of a SIMM employing 1M×4 DRAMs according to the prior art.

Referring now to FIG. 2, one typical design of a SIMM 26 utilizing 16 1M×4 DRAM chips 30a–30p to provide 8 megabytes of memory is shown. Each DRAM chip 32 is configured as 1M×4, and thus two chips together provide one megabyte of addressable memory. FIG. 2 illustrates a JEDEC standard layout for 16 1M×4 chips 30a–30p in a system which provides a 10×10 address bit memory matrix, with the configuration shown in FIG. 2. Sixteen chips together provide 8 megabytes of addressable memory. In particular, two chips together, when activated by RAS and CAS provide one megabyte of addressable memory.

Still referring to FIG. 2, the sixteen 1M×4 DRAM chips 30a–30p are mounted on a card in a conventional manner to form an 8 megabyte SIMM card. The SIMM card receives, among other signals, a Write Enable (WE), four CAS signals, CAS0, CAS1, CAS2, and CAS3, and two RAS signals, RAS0 and RAS1, which are connected to SIMM RAS0 and SIMM RAS2 and SIMM RAS1 and SIMM RAS3, respectively, as well as address bits A0–A9 on an address bus. The signals and addresses are all provided from the memory controller 20 as shown in FIG. 1. The chips are connected as shown in FIG. 2. The important thing to note is that each of the chips has a 10-bit address in the row dimension so that there is 1K ($2^{10}$, 1,024) address bits in the row dimension of each chip. Also, there are $2^{10}$ address bits in each of two chips in the column dimension. Thus, each two chips have $2^{10} \times 2^{10}$ or one megabyte of addressable space. Thus, the actuation of RAS0 actuates the row address of the chips 30a–30h, and the activation of RAS1 actuates the row address in chips 30i–30p. Hence, eight megabytes of data are addressable from the memory controller to provide data on a bus which is 36 bits wide, i.e. DQ0–DQ35. (It should be noted that DQ pins 8, 17, 26 and 35 are not shown, these normally being reserved for parity bits.)

Figure 3:
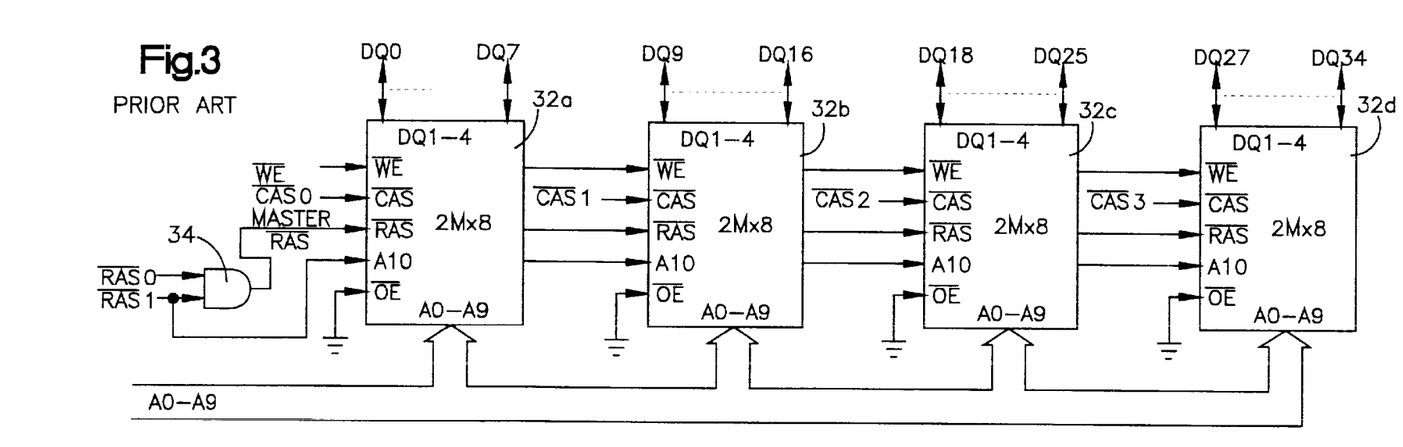
FIG. 3 is a high level diagram of a SIMM card employing 2M×8 DRAMs according to the prior art.

A prior art implementation for SIMMs 26 wherein 2M×8 DRAM chips are used in place of 1M×4 DRAM chip of the prior art is shown in FIG. 3. Four 2M×8 DRAMs 32a, 32b, 32c and 32d are utilized, each of which has 11 addressable bit spaces in the row dimension and 10 addressable bit spaces in the column dimension. Eleven address bits add another 1,024 addresses to the row address, making a total of 2,048 addresses in the row dimension. Since these chips are each 11×10, one chip contains two megabytes of addressable space, and thus chip 32a is equivalent to chips 30a, 30b, 30i and 30j; chip 32b is equivalent to chips 30c, 30d, 30k and 30l; chip 32c is equivalent to chips 30e, 30f, 30m and 30n; and chip 32d is equivalent to chips 30g, 30h, 30o and 30p of the configuration shown in FIG. 2. As indicated above, the memory controller is configured to address only row address spaces A0 through A9. However, since adding one more row address bit essentially doubles the addressing capability in the row dimension to 2,048 addresses, only one RAS signal is needed to activate the row address in the SIMMs. Thus, one of the RAS signals can be used to actuate the 11th row address bit on chips 32a, 32b, 32c and 32d when a RAS read/write is called for. FIG. 3 shows an implementation of such a scheme. If either RAS0 or RAS1 goes active, a master RAS signal is generated. Also, one of the RAS signals, in this case RAS1, is tied to the 11th address bit in the row address A10, and when this RAS goes active, it also provides the bit for this A10 address space. Since in the preferred implementation the RAS0 and RAS1 signals are active low, RAS0 and RAS1 are ANDed in AND gate 34. AND gate 34 will generate a master RAS signal, which will be active low if either RAS0 or RAS1 is low, and the A10 address bit will be actuated only if RAS1 is low. Thus, when RAS0 is actuated, a master RAS signal is generated, and the address is only on the low order bits (A0–A9) and not the high order bit A10, thus writing or reading the lower 1,024 addresses. If RAS1 is actuated, a master RAS is generated, which also supplies a bit to address A10, thus writing or reading the high order bits 1,025–2,048 addresses. (It should be noted that other address control signals than RAS0 and RAS1 could be manipulated to form the high order bit, provided there is an excess of at least one segment generated over that which is necessary to actuate the address function.

However, this particular implementation has two problems. The principal problem is encountered when the system does refresh of DRAMs, by a conventional RAS Only Refresh (ROR). In this convention, a refresh cycle occurs when both RAS0 and RAS1 go low. AND gate 34 will also generate an active master RAS signal when both RAS0 and RAS1 are low. Both RAS0 and RAS1 being low at the same time causes an impermissible condition for a read/write operation for the data, and thus this is used to denote a refresh. This type of refresh is well known in the art, and the data on a particular row is represented on each refresh cycle. However, with the implementation shown in FIG. 3, on every refresh cycle RAS1 will be low, which means that the A10 address bit will always be actuated, and hence refresh will never occur on the row address of the chip where A10 is not active, i.e., where the addresses are contained in the A0–A9 address range only. Expressed another way, only the higher order rows (1,025–2,048) will be refreshed since A10 designating the high order rows will always be active during refresh.

A second problem with the prior art shown in FIG. 3 is that the timing of the switching of the active address bit for address A10 and the master RAS signal may be adversely affected due to the potential difference in the transition or slew rates of the RAS0 and RAS1 signals on the one hand and the transition rate of the master RAS through the AND gate on the other hand. This is illustrated by reference to the signals as shown in FIG. 4.

Figure 4:
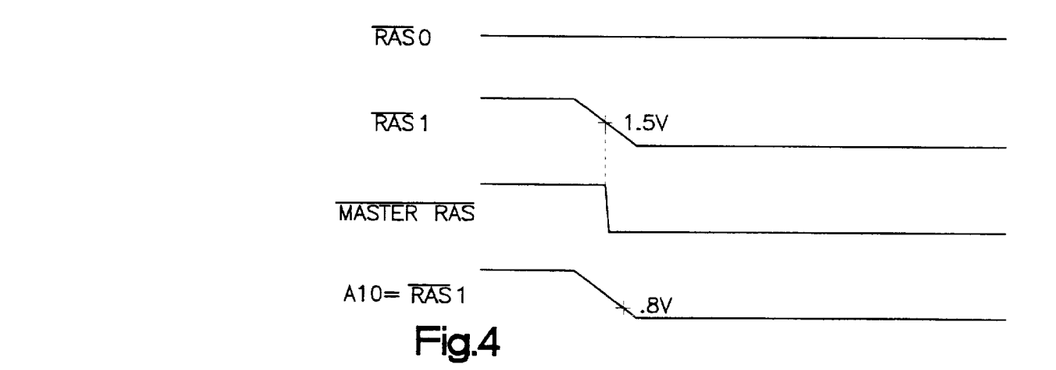
FIG. 4 is a signal diagram of certain of the signal configurations of the logic shown in FIG. 3.

FIG. 4 shows a hypothetical case where RAS1 is to become active, thereby actuating the master RAS, and also generating a data bit for data for address A10 in the row column. As can be seen, RAS0 stays high and RAS1 goes low. Since the RAS signals are being generated by the memory controller and the master RAS is being generated by the AND gate 34, the rate of transition and the transition point for the signals becoming valid may vary widely depending upon the technologies used to manufacture the memory controller 20 and the AND gate 34 which may be different technologies. For example, as shown in FIG. 4, transition time for RAS1 generated by the memory controller 20 is significantly longer than the transition time for the master RAS generated by AND gate 24. Also, the point where master RAS becomes valid and thus transitions is located at a different point on the slope of the master RAS than where the address on A10 (which is RAS1) becomes valid. For example, as depicted in FIG. 4, the AND gate causes a transition to occur at about 1.5 volts on the RAS1 curve, whereas the address does not become valid until the RAS1 has dropped to about 0.8 volts. Thus, in this hypothetical case, the master RAS will have become active before the valid address is on the A10 address port, thus causing invalid data on a read/write cycle. This difference in time of transition and point of transition may differ from technology to technology. Moreover, the uncertain region during this transition period may cause erratic results. In any event, this is a potential problem where different technologies may result in different times of transition and in different points on the transition curve where transitions take place.

Figure 5:
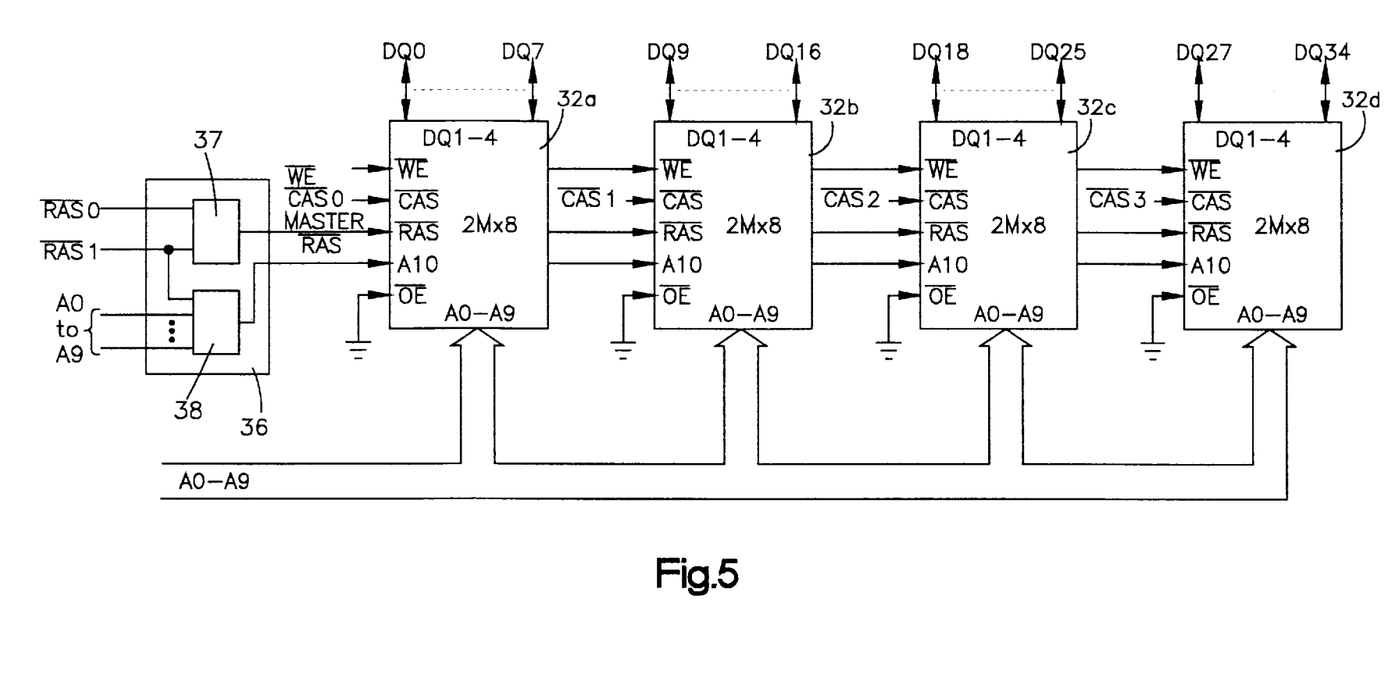
FIG. 5 is a high level diagram of a SIMM card employing 2M×8 DRAMs according to the present invention.

The present invention overcomes the problems depicted in FIGS. 3 and 4 and is shown diagrammatically in FIG. 5 wherein the refresh of all the bits, both low and high order, take place with a ROR refresh mode, and also the problem of different transition rates and different transition points is solved. The layout of the 2M×8 chips 32a–32d is the same as shown in FIG. 3. However, logic is introduced on ASIC chip 36 which overcomes the problems attendant to the configuration shown in FIG. 4, wherein only an AND gate is used. The logic on the ASIC chip 36 allows refresh of both the high order and low order bits, and also provides for the proper timing so that the address for address bit A10 is valid before the master RAS signal becomes active. The logic also generates the high order bit as a function of both the value (high or low) of one RAS signal and also of at least one address generated by the CPU.

Figure 6:
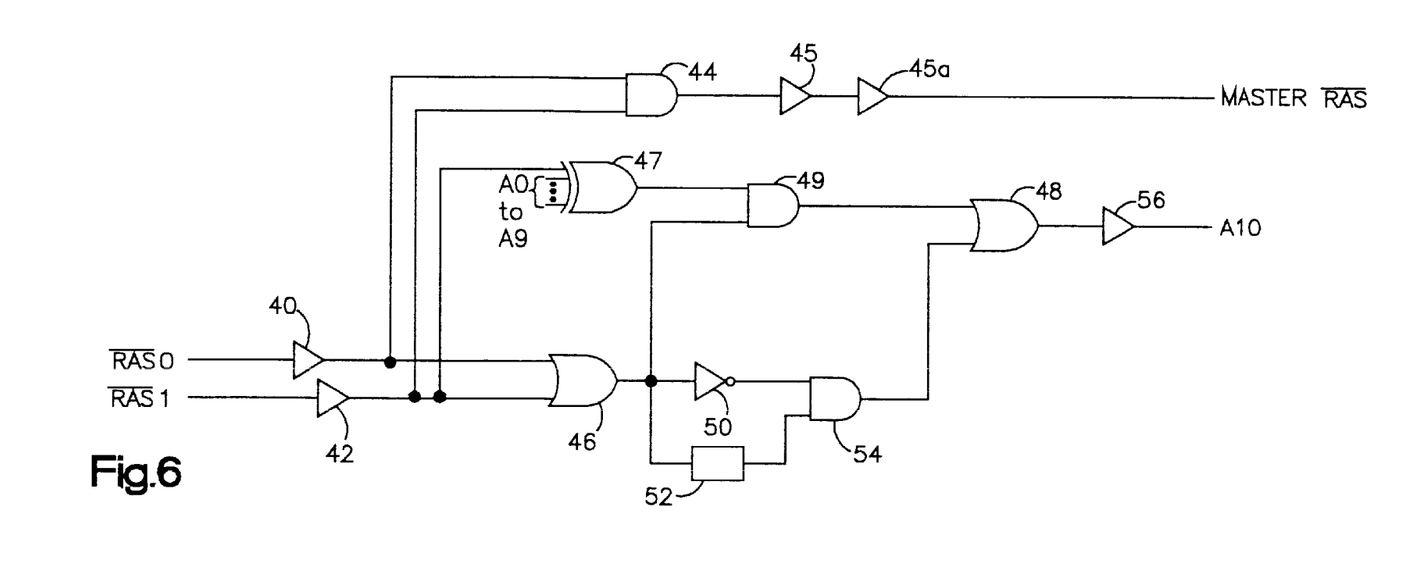
FIG. 6 is a logic diagram showing the logic of the present invention for operating the SIMM having the DRAM configurations shown in FIG. 5.

The logic contained on the ASIC chip 36, including a master RAS generator 37 and a high order address generator 38, is shown in FIG. 6. The other signals, such as CAS, WE, OE, etc. are not shown as they are the conventional signals outputted by the memory controller 20.

Figure 7:
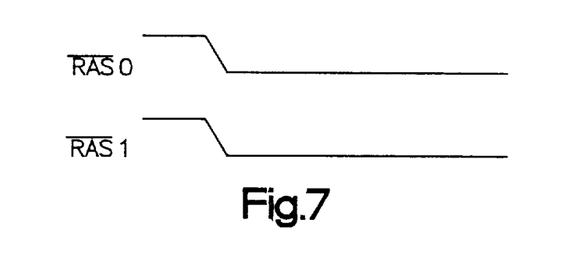
FIG. 7 is a signal diagram of the RAS signals utilizing the circuit of FIG. 6.

As can be seen in FIG. 6, RAS0 is delivered to a receiver 40, and RAS1 is delivered to a receiver 42. The purpose of each receiver is to provide a very rapid slew rate or transition time between active and inactive signals for RAS0 and RAS1 in a well-known manner. The signal transitions are shown in FIG. 7. From the receivers 40 and 42, the RAS0 and RAS1 signals are delivered to AND gate 44, the output of which is impressed on the input of a delay device 45, the output of which is a master RAS signal which constitutes the RAS for the SIMM 26 through device driver 45a. The outputs of receivers 40 and 42 are also delivered as the inputs to OR gate 46 and the RAS1 signal is also delivered as one input to XOR gate 47. The addresses A0–A9 are also provided as inputs to XOR gate 47. The output of XOR gate 47 is provided as one input to AND gate 49. The other input to AND gate 49 is from the output of OR gate 46. The output of AND gate 49 is provided as one input to OR gate 48. XOR gate 47 functions by providing a high output if there are an even number of high inputs, and a low output it there are an odd number of high inputs. The output of OR gate 46 is also delivered as the input of an inverter 50 and also as input to a counter 52 which counts 2,048 bits. The output of inverter 50 and the counter 52 are provided as inputs to AND gate 54, the output of which is provided as the other input to OR gate 48. The output of OR gate 48 is delivered to a driver 56, the output of which is impressed as a signal on address pin A10. The operation of the logic circuit is generally as follows: The RAS0 and RAS1 signals are outputted from the receivers 40 and 42 to AND gate 44, the output of which is provided to delay device 45 and device driver 45a and outputted as a master RAS to the DRAMs 32a–32d. The purpose of the receivers 40 and 42 and the delay device 45 is to assure that the master RAS signal does not reach the chip until the signal on the A10 has become valid. This is accomplished by providing a rather quick transition of the RAS0 and RAS1 signals by the receivers 40 and 42 so that the transition time or slew rate is very rapid in transition from either the active state to the inactive state or the inactive state to the active state, as shown in FIG. 7, and there is also a definite preselected delay value for the master RAS.

The rest of the circuitry is configured such that the value impressed on A10 address is a function of the value of RAS1 and the address delivered to XOR gate 47 from the CPU 10. As explained above, the XOR gate 47 operations are such that if there are an even number of inputs to the XOR gate 47, its output is high or "1" and if there are an odd number of inputs to the XOR gate 47, its output is low or "0". Since either RAS0 or RA is always high except during refresh, one input to AND gate 49 is always high. Thus, the output from XOR gate 47 to AND gate 49 controls whether the A10 pin has a "1" or "0" impressed thereon. This provides a benefit to the system in that if there is a sequence of addresses being addressed on either a read or write cycle, all of the activity will not be at the same location in the DRAMs causing a "hot spot", but rather the location of the activity will switch between a location where the A10 pin is high or "1" and a location where the A10 pin is low or "0", e.g. the location will alternate back and forth on a read or write at requested sequential addresses from the CPU.

If both RAS1 and RAS0 go low, indicating a ROR refresh, during the first 1,024 refresh cycles, the signal on the A10 pin will remain high and inactive, thus sequentially refreshing the lower 1,024 address rows during these first 1,024 cycles. For the second 1,024 cycles of the refresh the signal on the pin A10 will go low and be active, thus sequentially refreshing the 1,025 to 2,048 rows during the next 1,024 cycles. Briefly, this can be described as follows: The output of OR gate 46 is low when and only when both RAS0 and RAS1 are low; i.e., both are active, which indicates the controller is doing a refresh. Since the output of OR gate 46 is low during refresh, one input to AND gate 49 is low, and thus the output from AND gate 49 to one input of OR gate 48 is always low. The output of inverter 50 is the compliment of the output of the OR gate 46. Thus, if the output of AND gate 54 is low, the output of the inverter is high, and if the output of AND gate 54 is high, the output of the inverter is low. The output of RAS0 at all times, except when both RAS0 and RAS1 are low, causes the output of OR gate 46 to be low, which causes the inverter 50 to be high, which causes the signal from the counter 52 to be placed on the input of AND gate 54. OR gate 48 allows the output from the AND gate 54 to be outputted to the driver 56 when both RAS0 and RAS1 are low and the output from OR gate 47 is immaterial since the other input to AND gate 49 is always low during refresh. The output of counter 52 is its most significant bit which is inputted to AND gate 54. Since the counter is a 2,048 bit binary counter, the most significant bit will be a logic 0 through the first 1,024 cycles and then a logic 1 for the next 1,024 cycles.

Moreover, since the output of AND gate 49 is always low during refresh, one input to OR gate 48 is always low, and in input to AND gate 54 is always high during refresh, the output of OR gate 48 is controlled exclusively by the output on counter 52. Each time RAS0 and RAS1 both go from low to high, the counter is incremented. Thus, the counter steps through 2,048 cycles. During the first 1,024 cycles the counter's most significant bit output is a "0," in which case the input on the A10 address pin is low. During the second 1,024 clock cycles, the most significant bit output of the counter is a "1," which causes the output into the address pin A10 to be active low as a binary "1". Thus, to summarize, if only RAS0 goes active low, the output from the OR gate 48 and hence the output of the driver 56 is not outputted, and the A10 address pin remains inactive. If only the RAS1 signal goes low, the output from OR gate 48 is the RAS signal R1, thus the output of the driver 56 is also the output of RAS1 which is low, thus causing the address pin A10 to go low, being a "1". If, however, both RAS0 and RAS1 go low, the output from the OR gate 48, and hence the driver 56, is either low or high, depending on whether the counter is in its first 1,024 cycles or second 1,024 cycles—if the counter is in its first 1,024 cycles the output is low and the A10 is inactive high; if in the second 1,024 cycles the output is high and the A10 pin is active low and a binary 1. In order to better understand the output of the driver 56 based on the inputs, a composite truth table based on the RAS0 and RAS1 inputs for the output to the address A10 is shown below.

| RAS ONLY REFRESH TRUTH TABLE | | |
|---|---|---|
| RAS0 IN | RAS1 IN | A10 OUT |
| 0 | 0 | Counter |
| 0 | 1 | RAS1 |
| 1 | 0 | RAS1 |
| 1 | 1 | DON'T CARE |

The logic has been described as including all of the address signals from the CPU as inputs to the XOR gate 47. However, less than all of the address signals could be used as inputs to the XOR gate 47; indeed, even just one address signals could be used, e.g. the low order address signal. In such a case, the A10 pin would alternative high and low on each successive load of contiguous addresses.

The invention has been described as it is used with DRAM cards on SIMMs. However, the utilization is not so limited. The invention can be used with various other memories and as DIMMs or even "on-board" or "planar" or "system" memories.

Accordingly, the preferred embodiment of a SIMM and system for utilizing a SIMM having a 2M×8 DRAM thereon has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of controlling the operation of memory in a computer system with signals from a memory controller which outputs Y row address signals and first and second address control signals, and wherein said memory is comprised of DRAM chips having Y+1 bit row addresses and is actuated by a single address control signal, said method comprising the steps of:

providing said first address control signal in combination with at least one of said address signals from said computer system as the high order bit of said Y+1 address, forming a master address control signal which becomes active responsive to either of said first or second address control signals becoming active, said method being further characterized by said system performing refresh operations on each row address individually, sequentially based on both said first and second address control signals becoming active at the same time, and controlling the application of said first address control signal as said high order bit of said address during a refresh cycle to provide refresh to each row after a given number of refresh cycles.

2. The method as defined in claim 1 wherein first and second address control signals are first and second RAS signals, and said master address control signal is a master RAS signal.

3. The method as defined in claim 2 wherein logic is used to generate said master RAS signal and said high order bit are generated on an ASIC chip.

4. The method as defined in claim 1 wherein said refresh cycles are counted, and the row being activated for refresh is a function of said count.

5. The method of claim 2 wherein logic is used to generate said master RAS signal and said high order bit are generated on an ASIC chip, and wherein refresh cycles are counted and the row being activated for refresh is a function of said count.

6. The method as defined in claim 1 wherein said memory being refreshed is on a memory card in the computer system.

7. The method of claim 1 wherein said DRAM chip includes 2M×8 bit DRAMs which are addressed in an 11 row by 10 column configuration.

8. A method of controlling the operation of memory in a computer system with signals from a memory controller which outputs Y row address signals and first and second address control signals, and wherein said memory is comprised of DRAM chips having Y+1 bit row addresses and is actuated by a single address control signal, said method comprising the steps of:

providing said first address control signal in combination with at least one of said address signals from said memory controller as the high order bit of said Y+1 address, forming a master address control signal which becomes active responsive to either of said first or second address control signals becoming active, said method being further characterized by controlling the transition time of said one of said address control signals between its inactive and active status, and of said master address control signal between its inactive and its active status, such that the transition of one of said address control signal occurs before the transition of said master address control signal.

9. The method as defined in claim 8 wherein said first and second address control signals are first and second RAS signals and said master address control signal is a master RAS signal.

10. The method of claim 9 wherein said master RAS signal and one of said first and RAS signals forming the high order bits are generated by an ASIC chip.

11. A computer system comprising:

a memory controller which outputs Y row address signals and first and second address control signals, memory including DRAM chips having Y+1 bit row address, logic circuitry to receive said first and second address control signals from said memory controller and generate a master address control signal responsive to either said first or second address control signal becoming active and generate the high order bit of said address when said first address control signal becomes active in combination with at least one of said address signals from said computer system, said logic circuit having circuitry to enable refresh operation on each row address individually, sequentially responsive to both said first and second address control signals from said memory controller at the same time and controlling the application of said first address control signal on said high order bit of said address during a refresh cycle.

12. The system of claim 11 wherein said first and second address control signals are first and second RAS signals, and said master control signal is a master RAS.

13. The system of claim 12 wherein said logic circuit includes a counter connected to control the application of said first RAS signal as a high order address bit during refresh cycles.

14. The system of claim 11 wherein said logic circuit is disposed on an ASIC chip.

15. The system as defined in claim 11 wherein said memory is a DRAM card.

16. The system as defined in claim 11 wherein said memory includes 2M×8 bit DRAMs in an 11 row by 10 column address configuration.

17. A memory card for use in conjunction with a memory controller which outputs Y row address signals and first and second address control signals, said memory card comprising:

DRAM chips having Y+1 bit row address, logic circuitry to receive said first and second address control signals from said memory controller and generate a master address control signal responsive to either said first or second address control signal becoming active and generate the high order bit of said address has been changed to when said first address control signal becomes active in combination with at least one of said address signals from a computer system, said logic circuit having circuitry to enable refresh operation on each row address individually, sequentially responsive to both said first and second address control signals from said memory controller at the same time and controlling the application of said first memory control signal on said high order bit of said address during a refresh cycle.

18. The memory card of claim 17 wherein said first and second address control signals are first and second RAS signals, and said master address control signal is a master RAS signal.

19. The memory card of claim 18 wherein said logic circuit includes a counter connected to control the application of said first RAS signal as a high order address bit during refresh cycles.

20. The memory card of claim 17 wherein said logic circuit is disposed on an ASIC chip.

21. The memory card as defined in claim 17 wherein said memory is a DRAM card.

22. The memory card as defined in claim 17 wherein said memory includes 2M×8 bit DRAMs in an 11 row by 10 column address configuration.

* * * * *